(12) United States Patent
Kuramochi et al.

(10) Patent No.: US 8,179,154 B2
(45) Date of Patent: May 15, 2012

(54) DEVICE, TEST APPARATUS AND TEST METHOD

(75) Inventors: Yasuhide Kuramochi, Miyagi (JP); Masayuki Kawabata, Miyagi (JP)

(73) Assignee: Advantest Corporation, Tokyo (JP)

( * ) Notice: Subject to any disclaimer, the term of this patent is extended or adjusted under 35 U.S.C. 154(b) by 274 days.

(21) Appl. No.: 12/261,056

(22) Filed: Oct. 30, 2008

(65) Prior Publication Data

US 2010/0109674 A1 May 6, 2010

(51) Int. Cl.
*G01R 31/26* (2006.01)
(52) U.S. Cl. .................................. 324/762.01
(58) Field of Classification Search .................. 324/765, 324/763, 158.1, 754, 73.1; 714/718, 724, 714/762.01–762.07, 754.01–754.3
See application file for complete search history.

(56) References Cited

U.S. PATENT DOCUMENTS

| | | | |
|---|---|---|---|
| 5,659,312 A | | 8/1997 | Sunter et al. |
| 6,087,843 A | * | 7/2000 | Pun et al. ...................... 324/765 |
| 6,281,698 B1 | * | 8/2001 | Sugimoto et al. ............. 324/765 |
| 7,317,324 B2 | * | 1/2008 | Watanabe et al. ......... 324/762.02 |
| 7,342,405 B2 | * | 3/2008 | Eldridge et al. .............. 324/765 |

FOREIGN PATENT DOCUMENTS

| | | |
|---|---|---|
| JP | 03-284862 | 12/1991 |
| JP | 2001174520 | 6/2001 |
| JP | 2001264388 | 9/2001 |
| JP | 2002-236151 | 8/2002 |
| JP | 2008058200 | 3/2008 |

OTHER PUBLICATIONS

"Search Report of PCT counterpart application", issued on Nov. 17, 2009, p. 1-p. 5.
"Search Report of PCT counterpart application", issued on Jun. 16, 2011, p. 1-p. 5 (This is English version of Search Report of PCT counterpart application. Japanese version of this search report was submitted on Dec. 1, 2009).

* cited by examiner

*Primary Examiner* — Jermele M Hollington
*Assistant Examiner* — Tung X Nguyen
(74) *Attorney, Agent, or Firm* — Jianq Chyun IP Office

(57) ABSTRACT

Provided is a test apparatus that tests a device under test. The device under test includes: a circuit under test; and a switching section that that connects an internal terminal being tested, from among one or more internal terminals of the circuit under test, to external terminals connected to the test apparatus. The test apparatus includes: a measuring section that controls a relay section, which provides a connection or a disconnect between two of the external terminals such that a transmission characteristic of the relay section in a connected state serves as a basis for calculating the transmission characteristic between each external terminal and each internal terminal of the circuit under test, to be in a connected state and measures the transmission characteristic of the relay section via the two external terminals; and a compensating section that compensates a signal to be supplied to the circuit under test via an external terminal and the switching section and/or a signal acquired from the circuit under test via the switching section and an external terminal, based on the measured transmission characteristic of the relay section.

21 Claims, 10 Drawing Sheets

DEVICE, TEST APPARATUS AND TEST METHOD

BACKGROUND

1. Technical Field

The present invention relates to a device, a test apparatus, and a test method.

2. Related Art

When testing a device, if a signal is supplied from an external unit to an arbitrary circuit point of the device or if a signal is acquired by an external unit from an arbitrary circuit point of the device, it is necessary to provide the device with an external terminal for testing and signal lines providing a connection between the external terminal and arbitrary points in the circuit. Therefore, if a signal must be acquired or supplied at many circuit points in the device during testing, the device must be provided with many external terminals. This causes an undesirable increase in the circuit size of the device.

U.S. Pat. No. 5,659,312 discloses a device provided with an internal DA converter and AD converter for testing. Japanese Patent Application Publication No. 03-284862 discloses a semiconductor apparatus in which a plurality of analog circuits under test are connected to a single test terminal via an analog switch. Both of these inventions decrease the number of external terminals used for testing.

Japanese Patent Application Publication No. 2002-236151 discloses an auxiliary apparatus that causes the output of the DA converter in the circuit under test to loop-back to the AD converter in the circuit under test via an external circuit under test, thereby enabling the circuit under test to perform a self-test. Since the loop-back line is formed outside of the circuit under test, this invention enables accurate testing, because the loop-back line has low distortion.

However, the device disclosed in U.S. Pat. No. 5,659,312 requires that a DA converter and AD converter be disposed inside the device, which leads to higher cost. Furthermore, measurement accuracy of this device is limited by the capabilities of the AD converter and the DA converter, making it difficult to achieve accurate testing.

The semiconductor apparatus described above creates signal distortion due to the analog switch, and therefore it is difficult to perform accurate measuring. Finally, with the auxiliary device described above, it is difficult to measure arbitrary circuit points in the device under test.

SUMMARY

Therefore, it is an object of an aspect of the innovations herein to provide a device, a test method, and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary device may comprise: a circuit under test; two external terminals connected to an external test apparatus; a switching section that connects an internal terminal being tested, from among one or more internal terminals of the circuit under test, to the external terminals; and a relay section that provides a connection or a disconnect between the two external terminals, such that a transmission characteristic of the relay section in a connected state serves as a basis for calculating the transmission characteristic between each external terminal and each internal terminal of the circuit under test.

According to a second aspect related to the innovations herein, one exemplary test apparatus may include a test apparatus that tests a device under test. The device under test includes: a circuit under test; and a switching section that that connects an internal terminal being tested, from among one or more internal terminals of the circuit under test, to external terminals connected to the test apparatus. The test apparatus includes: a measuring section that controls a relay section, which provides a connection or a disconnect between two of the external terminals such that a transmission characteristic of the relay section in a connected state serves as a basis for calculating the transmission characteristic between each external terminal and each internal terminal of the circuit under test, to be in a connected state and measures the transmission characteristic of the relay section via the two external terminals; and a compensating section that compensates a signal to be supplied to the circuit under test via an external terminal and the switching section and/or a signal acquired from the circuit under test via the switching section and an external terminal, based on the measured transmission characteristic of the relay section.

According to a third aspect related to the innovations herein, one exemplary method may include a method for testing a device under test. The device under test includes: a circuit under test; and a switching section that connects an internal terminal being tested, from among one or more internal terminals of the circuit under test, to external terminals. The method comprises: controlling a relay section, which provides a connection or a disconnect between two of the external terminals such that a transmission characteristic of the relay section in a connected state serves as a basis for calculating the transmission characteristic between each external terminal and each internal terminal of the circuit under test, to be in a connected state and measuring the transmission characteristic of the relay section via the two external terminals; and compensating a signal to be supplied to the circuit under test via an external terminal and the switching section and/or a signal acquired from the circuit under test via the switching section and an external terminal, based on the measured transmission characteristic of the relay section.

According to a fourth aspect related to the innovations herein, one exemplary test apparatus may include a test apparatus that tests a circuit under test formed on a wafer under test, comprising: a testing wafer that includes a test circuit that transfers signals to and from the circuit under test; and a connecting wafer that electrically connects the test circuit to the circuit under test. The connecting wafer includes: two external terminals connected to the test circuit; a switching section that connects an internal terminal being tested, from among one or more internal terminals of the circuit under test, to the external terminals; and a relay section that provides a connection or a disconnect between the two external terminals, such that a transmission characteristic of the relay section in a connected state serves as a basis for calculating the transmission characteristic between each external terminal and each internal terminal of the circuit under test. The test circuit includes: a measuring section that controls a relay section to be in a connected state and measures the transmission characteristic of the relay section via the two external terminals; and a compensating section that compensates a signal to be supplied to the circuit under test via an external terminal and the switching section and/or a signal acquired from the circuit under test via the switching section and an external terminal, based on the measured transmission characteristic of the relay section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
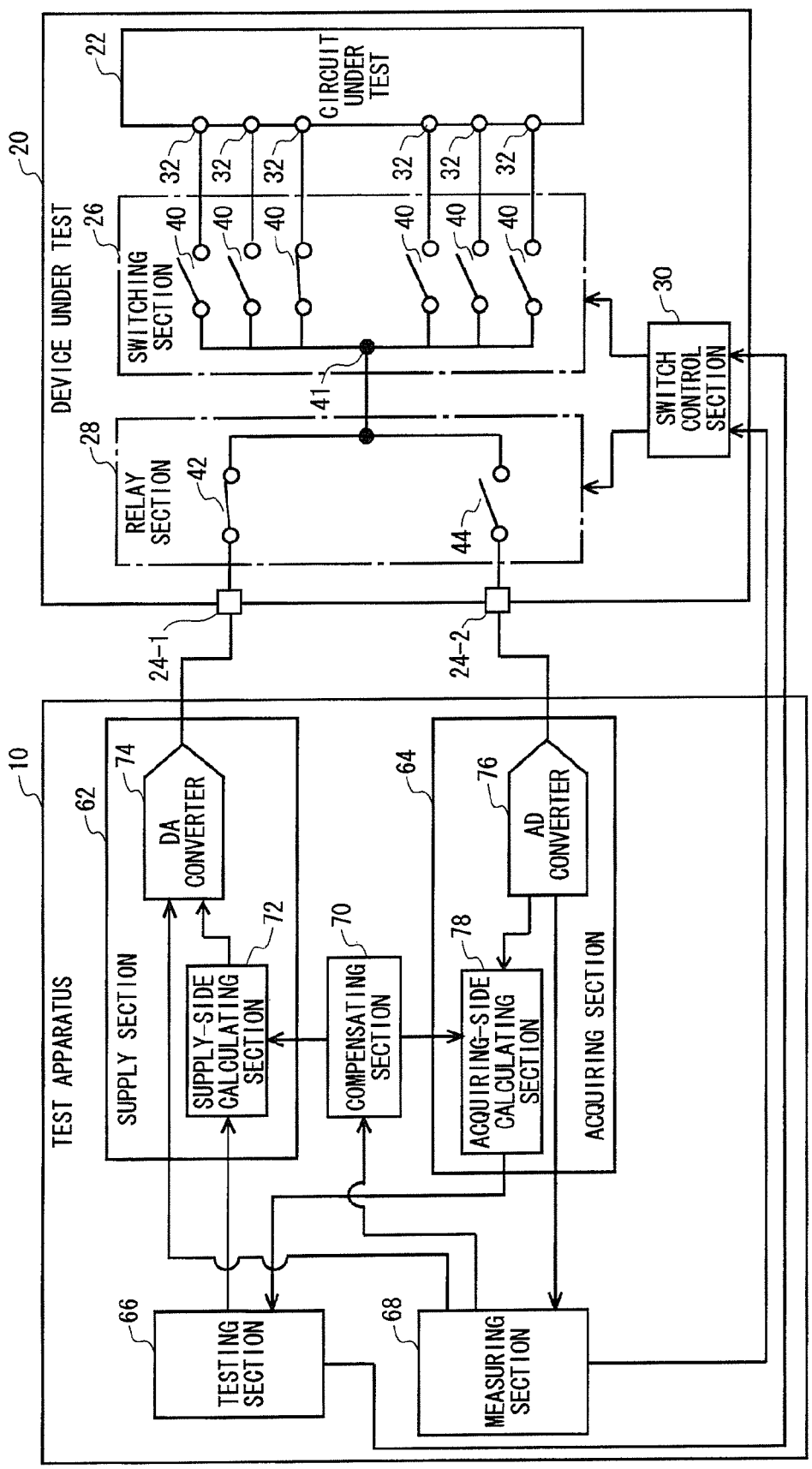
FIG. 1 shows exemplary configurations of a test apparatus 10 and a device under test 20 according to an embodiment of the present invention.

FIG. 1 shows exemplary configurations of a test apparatus 10 and a device under test 20 according to an embodiment of the present invention. The test apparatus 10 tests the device under test 20.

The device under test 20 may be a semiconductor apparatus such as an IC or an LSI. The device under test 20 includes a circuit under test 22, two external terminals 24 for testing, a switching section 26, a relay section 28, and a switch control section 30.

The circuit under test 22 is the circuit in the device under test 20 that is tested by the test apparatus 10. The circuit under test 22 has one or more internal terminals 32. Each internal terminal 32 is positioned at a certain point in the circuit set by the designer of the device under test 20 or the like. During testing of the device under test 20, a signal is supplied from or acquired by the test apparatus.

The two external terminals 24 are connected to the external test apparatus 10 during testing of the device under test 20. One of the two external terminals 24 is an external input terminal 24-1 that receives the signal from the test apparatus 10, and the other is an external output terminal 24-2 that acquires the signal for the test apparatus 10.

The switching section 26 connects the internal terminal 32 being tested, from among the one or more internal terminals 32 of the circuit under test 22, to an external terminal 24. In other words, the switching section 26 provides a connection between (i) the external input terminal 24-1 or the external output terminal 24-2 and (ii) one internal terminal 32 designated as the test target from among the plurality of internal terminals 32. The switching section 26 separates the external input terminal 24-1 or the external output terminal 24-2 from all of the internal terminals 32 other than the internal terminal 32 designated as the test target.

The relay section 28 provides a connection or a disconnect between the two external terminals 24. In other words, the relay section 28 provides a connection or a disconnect between the external input terminal 24-1 and the external output terminal 24-2.

The switch control section 30 controls whether the switching section 26 and the relay section 28 are in a connected or disconnected state, based on instructions received from the external test apparatus 10. For example, the switch control section 30 may receive the instructions form the test apparatus 10 via an external terminal for testing, which is separate from the two external terminals 24. The switch control section 30 may instead receive the instructions form the test apparatus 10 via a terminal that receives a command from a CPU or the like during normal operation.

Here, a transmission characteristic of the relay section 28 in the connected state serves as a basis for calculating a transmission characteristic between the external terminals 24 and each internal terminal 32 of the circuit under test 22. The transmission characteristic of the relay section 28 can be measured by the external test apparatus 10 via the two external terminals 24, i.e. the external input terminal 24-1 and the external output terminal 24-2.

For example, while the relay section 28 is connected, the transmission characteristic of the line between the two external terminals 24 is identical to the transmission characteristics of the lines between the external terminals 24 and the internal terminals 32 connected to one another by the switching section 26. Furthermore, while the relay section 28 is connected, the circuit configuration of the line between the two external terminals 24 may be identical to the circuit configuration of the lines between the external terminals 24 and the internal terminals 32 connected to one another by the switching section 26.

This device under test 20 switches which of the plurality of internal terminals 32 in the circuit under test 22 are connected to the external terminals 24, and therefore requires fewer external terminals 24 for testing. Furthermore, in the device under test 20, the transmission characteristic of the relay section 28 providing the connection between the external terminals 24 serves as a basis for calculating the transmission characteristic of the lines between the external terminals 24 and the internal terminals 32 being tested. In this way, the device under test 20 allows the external test apparatus 10 to measure the transmission characteristic of the relay section 28, thereby enabling testing in which signal distortion between the external terminals 24 and the internal terminals 32 being tested is compensated for. Accordingly, the device under test 20 enables the test apparatus 10 to perform accurate testing.

In the example shown in FIG. 1, the switching section 26 includes one or more change-over switches 40. Each of the one or more change-over switches 40 corresponds respectively to one of the one or more internal terminals 32. Each change-over switch 40 provides a connection or a disconnect between the common contact point 41 and the corresponding internal terminal 32.

In the example shown in FIG. 1, the relay section 28 includes an input relay switch 42 that provides a connection or a disconnect between the external input terminal 24-1 and the common contact point 41, and an output relay switch 44 that provides a connection or a disconnect between the external output terminal 24-2 and the common contact point 41. When the relay section 28 is in a connected state, i.e. when the external input terminal 24-1 and the external output terminal 24-2 are connected to each other, the input relay switch 42 and the output relay switch 44 are both in a connected state. When the relay section 28 is in a disconnected state, i.e. when the external input terminal 24-1 and the external output terminal 24-2 are disconnected from each other, at least one of the input relay switch 42 and the output relay switch 44 is in a disconnected state.

Furthermore, in the example shown in FIG. 1, the change-over switch 40, the input relay switch 42, and the output relay switch 44 have the same characteristics as each other. Accordingly, the connection between the two external terminals 24 is provided by two switches with identical characteristics. Furthermore, each of the plurality of signal lines providing the connection between the two external terminals 24 and each of the plurality of internal terminals 32 uses two switches having identical characteristics. Therefore, the device under test 20 of the present embodiment causes the transmission characteristic of the line between the external terminals 24 when the relay section 28 is in the connected state to be the same as the transmission characteristic of each of the lines between the external terminals 24 and the internal terminals 32 connected to each other by the switching section 26.

The change-over switch 40, the input relay switch 42, and the output relay switch 44 may each be a semiconductor switch. In addition to providing a connection or disconnect, the change-over switch 40, the input relay switch 42, and the output relay switch 44 may each include an amplifier, an attenuator, a buffer, a filter, or the like.

The number of switches between each external terminal 24 and internal terminal 32 is equal to the number of switches between the two external terminals 24, and may be any number greater than or equal to 2. The number of switches between each external terminal 24 and internal terminal 32 may instead be a prescribed multiple (2 times, 3 times, etc.) of the number of switches between the two external terminals 24. In this case as well, the transmission characteristics of the lines between the external terminals 24 and the internal terminals 32 can be calculated by multiplying the transmission characteristics of the relay section 28 in the connected state by the prescribed multiple described above. Therefore, in the device under test 20, the transmission characteristic of the relay section 28 can serve as the basis for calculating the transmission characteristic of the lines between the external terminals 24 and the internal terminals 32.

The test apparatus 10 includes a supplying section 62, an acquiring section 64, a testing section 66, a measuring section 68, and a compensating section 70. During testing, the test apparatus 10 is connected to the external terminals 24, i.e. the external input terminal 24-1 and the external output terminal 24-2, of the device under test 20.

The supplying section 62 supplies the external terminal 24-1 of the device under test 20 with a signal corresponding to waveform data supplied thereto. The supplying section 62 includes a supply-side calculating section 72 and a DA converter 74, for example.

The supply-side calculating section 72 receives the waveform data from the testing section 66 and performs a compensation calculation designated by the compensating section 70 on the waveform data. The supply-side calculating section 72 supplies the compensated waveform data to the DA converter 74.

The DA converter 74 receives waveform data from the supply-side calculating section 72 or the measuring section 68. The DA converter 74 DA converts the supplied waveform data to generate an analog signal corresponding to the waveform data. The DA converter 74 supplies the generated signal to the external input terminal 24-1.

The acquiring section 64 acquires a signal from the device under test 20 and outputs waveform data corresponding to the acquired signal. The acquiring section 64 includes an AD converter 76 and an acquiring-side calculating section 78, for example.

The AD converter 76 receives a signal output from the external output terminal 24-2 of the device under test 20, and AD converts the signal to generate waveform data corresponding to the received signal. The AD converter 76 supplies the generated waveform data to the measuring section 68 or the acquiring-side calculating section 78.

The acquiring-side calculating section 78 receives the waveform data from the AD converter 76 and performs a compensation calculation designated by the compensating section 70 on the received waveform data. The acquiring-side calculating section 78 supplies the compensated waveform data to the testing section 66.

When testing the circuit under test 22, the testing section 66 sends a signal to the circuit under test 22 via an external terminal 24 and the switching section 26, and receives a signal output from the circuit under test 22 via an external terminal 24 and the switching section 26. More specifically, the testing section 66 controls the switching section 26 and the relay section 28 in the device under test 20 to provide a connection between the target internal terminal 32 of the circuit under test 22 and the external input terminal 24-1. The testing section 66 then supplies the supplying section 62 with the waveform data so that the supplying section 62 outputs a signal corresponding to the waveform data. In this way, the testing section 66 can supply a signal to the circuit under test 22 via an external terminal 24 and the switching section 26.

The testing section 66 controls the switching section 26 and the relay section 28 in the device under test 20 to provide a connection between the target internal terminal 32 of the circuit under test 22 and the external output terminal 24-2. The testing section 66 then receives a signal corresponding to the acquired waveform data from the acquiring section 64. In this way, the testing section 66 can acquire a signal from the circuit under test 22 via an external terminal 24 and the switching section 26. Furthermore, the testing section 66 may judge whether the waveform data of the acquired signal is the same as expected data.

The measuring section 68 controls the relay section 28 to be in the connected state, and then measures the transmission characteristic of the relay section 28 via the two external terminals 24. The measuring section 68 may measure a DC input/output characteristic of the relay section 28 as the transmission characteristic. The measuring section 68 may measure the transmission characteristic in a prescribed frequency range.

The compensating section 70 compensates the signal supplied to the circuit under test 22 via the external terminal 24 and the switching section 26 or the signal acquired from the circuit under test 22 via the switching section 26 and the external terminal 24, based on the transmission characteristics of the relay section 28 measured by the measuring section 68. For example, the compensating section 70 supplies the supply-side calculating section 72 with compensation data generated based on the transmission characteristic of the relay section 28, and compensates the waveform data received from the testing section 66 according to the compensation data. The compensating section 70 may instead supply the acquiring-side calculating section 78 with the compensation data generated based on the transmission characteristic of the relay section 28, and compensate the waveform data generated by the AD converter 76 according to the compensation data.

Figure 2:
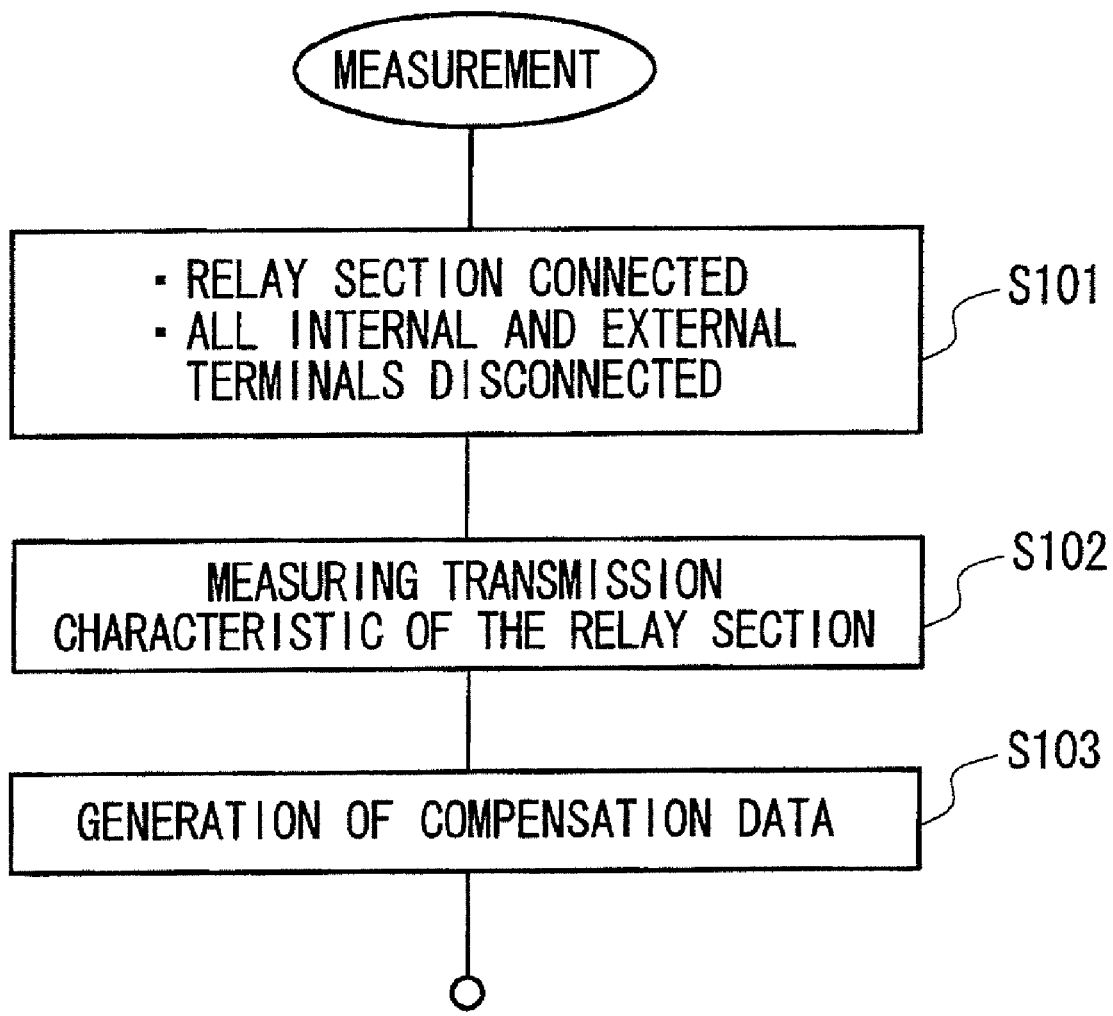
FIG. 2 shows the process flow performed by the test apparatus 10 when measuring the transmission characteristic of the relay section 28.

FIG. 2 shows the process flow performed by the test apparatus 10 when measuring the transmission characteristic of the relay section 28. First, with the relay section 28 of the device under test 20 in the connected state, the measuring section 68 disconnects all of the internal terminals 32 of the circuit under test 22 from the external terminals 24 (S101). In the present embodiment, the measuring section 68 sets the input relay switch 42 and the output relay switch 44 to the connected state, and sets all of the change-over switches 40 to the disconnected state.

Next, the measuring section 68 measures the transmission characteristic of the relay section 28 via the two external terminals 24 (S102). In the present embodiment, the measuring section 68 measures the transmission characteristic of a combination of the input relay switch 42 and the output relay switch 44 connected in series.

The process performed by the measuring section 68 at S102 is described in detail in the following. The measuring section 68 causes the supplying section 62 to supply the external input terminal 24-1 with a correction signal for a predetermined waveform, and causes the acquiring section 64 to acquire the correction signal from the external output terminal 24-2 after the correction signal passes through the relay section 28. The measuring section 68 then calculates the transmission characteristic of the relay section 28 based on (i) the waveform data of the correction signal supplied to the external input terminal 24-1 and (ii) the waveform data of the correction signal acquired by the external output terminal 24-2 after passing through the relay section 28. For example, if A(f) represents the supplied correction signal, B(f) represents the correction signal acquired after passing through the relay section 28, and f represents frequency, the measuring section 68 may calculate the transmission characteristics D(f) of the relay section 28 using Expression 1 shown below.

$$D(f)=B(f)/A(f) \quad \text{Expression 1:}$$

The measuring section 68 may measure the DC input/output characteristic of the relay section 28 using a ramp-wave correction signal, for example. In this way, the measuring section 68 can measure the transmission characteristic of the relay section 28.

Next, the measuring section 68 generates the compensation data that compensates for the distortion in the lines between the external terminals 24 and the target internal terminal 32, based on the measured transmission characteristic of the relay section 28 (S103). If the transmission characteristic of the relay section 28 is the same as the transmission characteristic of the line between the external terminals 24 and a target internal terminal 32, the measuring section 68 may generate the compensation data as an inverse characteristic of the transmission characteristic of the relay section 28. The measuring section 68 then stores the generated compensation data in the compensating section 70.

Figure 3:
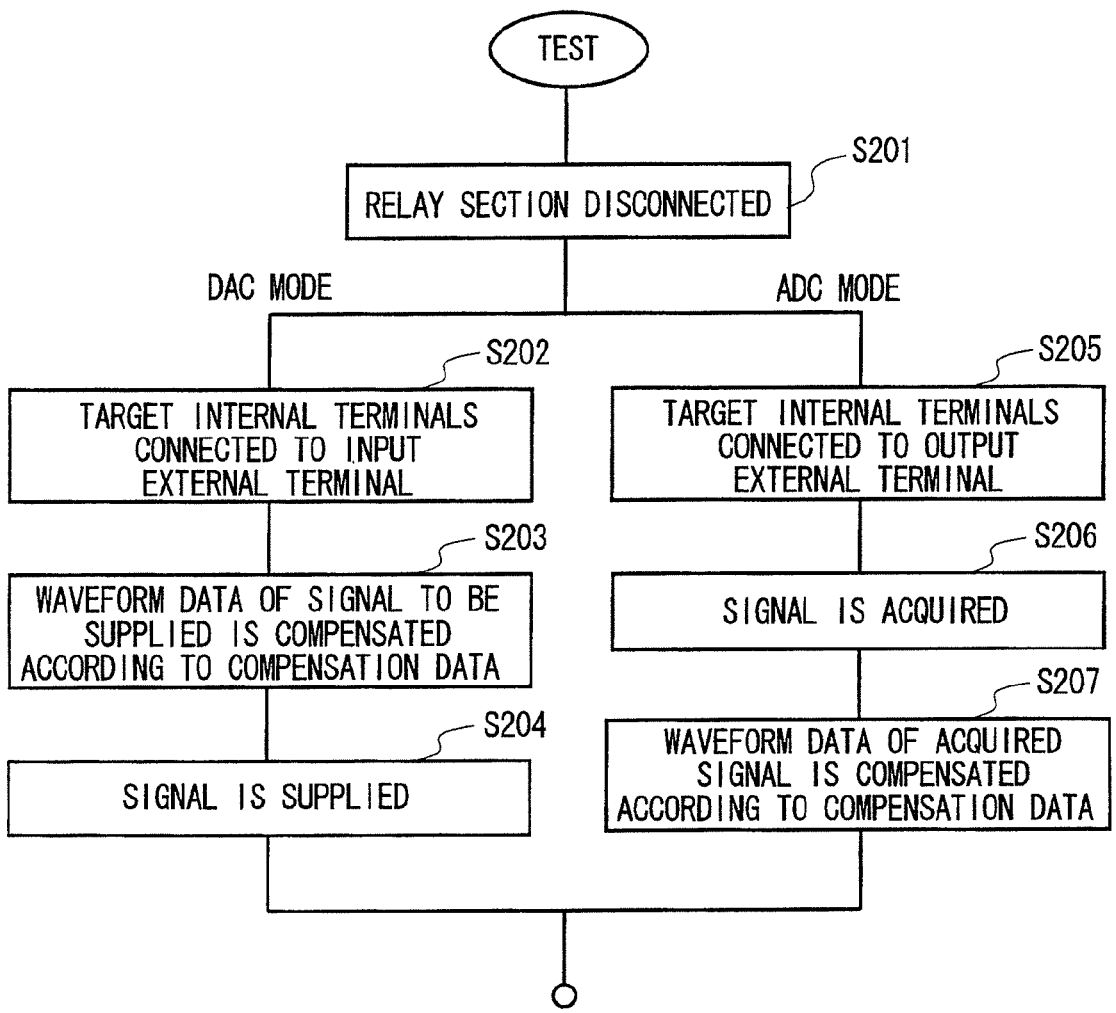
FIG. 3 shows the process flow performed by the test apparatus 10 when testing the circuit under test 22.

FIG. 3 shows the process flow performed by the test apparatus 10 when testing the circuit under test 22. First, the testing section 66 sets the relay section 28 to be in a state disconnected from the device under test 20 (S201). In the present embodiment, the testing section 66 disconnects the input relay switch 42 when operating in an ADC mode and disconnects the output relay switch 44 when operating in a DAC mode.

Next, in the DAC mode, the testing section 66 connects the target internal terminal 32 to the external input terminal 24-1 (S202). In the present embodiment, the testing section 66 connects the change-over switch 40 corresponding to the target internal terminal 32 and disconnects the change-over switches 40 corresponding to the internal terminals 32 that are not test targets.

Next, in the DAC mode, the testing section 66 generates the waveform data of the signal supplied to the target internal terminal 32. The compensating section 70 then compensates the waveform data generated by the testing section 66, according to the compensation data, and supplies the compensated waveform data to the DA converter 74 (S203). For example, the compensating section 70 superimposes the compensation data, which represents the inverse characteristic of the transmission characteristic of the relay section 28, onto the waveform data, which represents the waveform of the signal supplied to the target internal terminal 32.

Next, in the DAC mode, the DA converter 74 DA converts the compensated waveform data. The DA converter 74 then supplies a signal corresponding to the compensated waveform data to the external input terminal 24-1 (S204). In this way, in the DAC mode, the test apparatus 10 can supply the external input terminal 24-1 with a signal in which the distortion in the line between the external input terminal 24-1 and the target internal terminal 32 is compensated for.

In the ADC mode, on the other hand, the testing section 66 connects the target internal terminal 32 to the external output terminal 24-2 (S205). In the present embodiment, the testing section 66 connects the change-over switch 40 corresponding to the target internal terminal 32 and disconnects the change-over switches 40 corresponding to the internal terminals 32 that are not test targets.

Next, in the ADC mode, the AD converter 76 AD converts the signal output from the external output terminal 24-2. The AD converter 76 then outputs waveform data corresponding to the signal output from the external output terminal 24-2 (S206).

Next, in the ADC mode, the compensating section 70 compensates the waveform data output by the AD converter 76, according to the compensation data, and supplies the compensated waveform data to the testing section 66 (S207). For example, the compensating section 70 superimposes the compensation data, which represents the inverse characteristic of the transmission characteristic of the relay section 28, onto the waveform data, which represents the waveform of the signal output from the external output terminal 24-2. The compensating section 70 then supplies the compensated waveform data to the testing section 66. In this way, the test apparatus 10 can compensate for the distortion in the line between the external output terminal 24-2 and the target internal terminal 32, in the signal acquired from the external output terminal 24-2.

As described above, the test apparatus 10 enables a signal to be supplied to or acquired from a plurality of internal terminals 32 via two external terminals 24 for testing that are provided to the device under test 20.

Furthermore, the test apparatus 10 compensates the distortion occurring in the lines between the external terminal 24 and the target internal terminal 32, based on the transmission characteristics of the relay section 28 measured in advance. Therefore, the test apparatus 10 enables signals having the desired waveforms to be accurately supplied to the internal terminals 32, and enables the signals output by the internal terminals 32 to be accurately acquired. Accordingly, the test apparatus 10 can accurately test the device under test 20.

The device under test 20 may include the switching section 26 and the relay section 28 as the hardware used for testing, thereby decreasing the cost by minimizing the use of redundant circuits for testing. Since any circuit points in the circuit under test 22 can be tested by providing switches between the external terminals 24 and the circuit points to be tested, the device under test 20 can be designed easily. Furthermore, the number of internal terminals 32 being tested in the device under test 20 can be increased without adding excessive lines, and therefore the signal lines do not deteriorate because the wiring capacitance does not increase.

The test apparatus 10 tests the device under test 20 using the DA converter 74 and the AD converter 76 provided to the test apparatus 10, which enables faster and more accurate testing in comparison to the device under test 20 performing a self test using a DA converter and an AD converter provided therein. Even if the line between the external terminals 24 and the target internal terminal 32 causes a relatively large amount of distortion, e.g. if the line includes a simple source follower circuit having relatively low accuracy such as a buffer, amplifier, attenuator, or filter, the test apparatus 10 can compensate for the distortion to perform accurate testing. Furthermore, since the test apparatus 10 can compensate for the distortion, the switching section 26 and the relay section 28 of the device under test 20 can include switches with relatively large amounts of distortion but high voltage endurance. The test apparatus 10 performs the compensation using an open loop, and can therefore compensate a relatively stabilized high-band signal.

Figure 4:
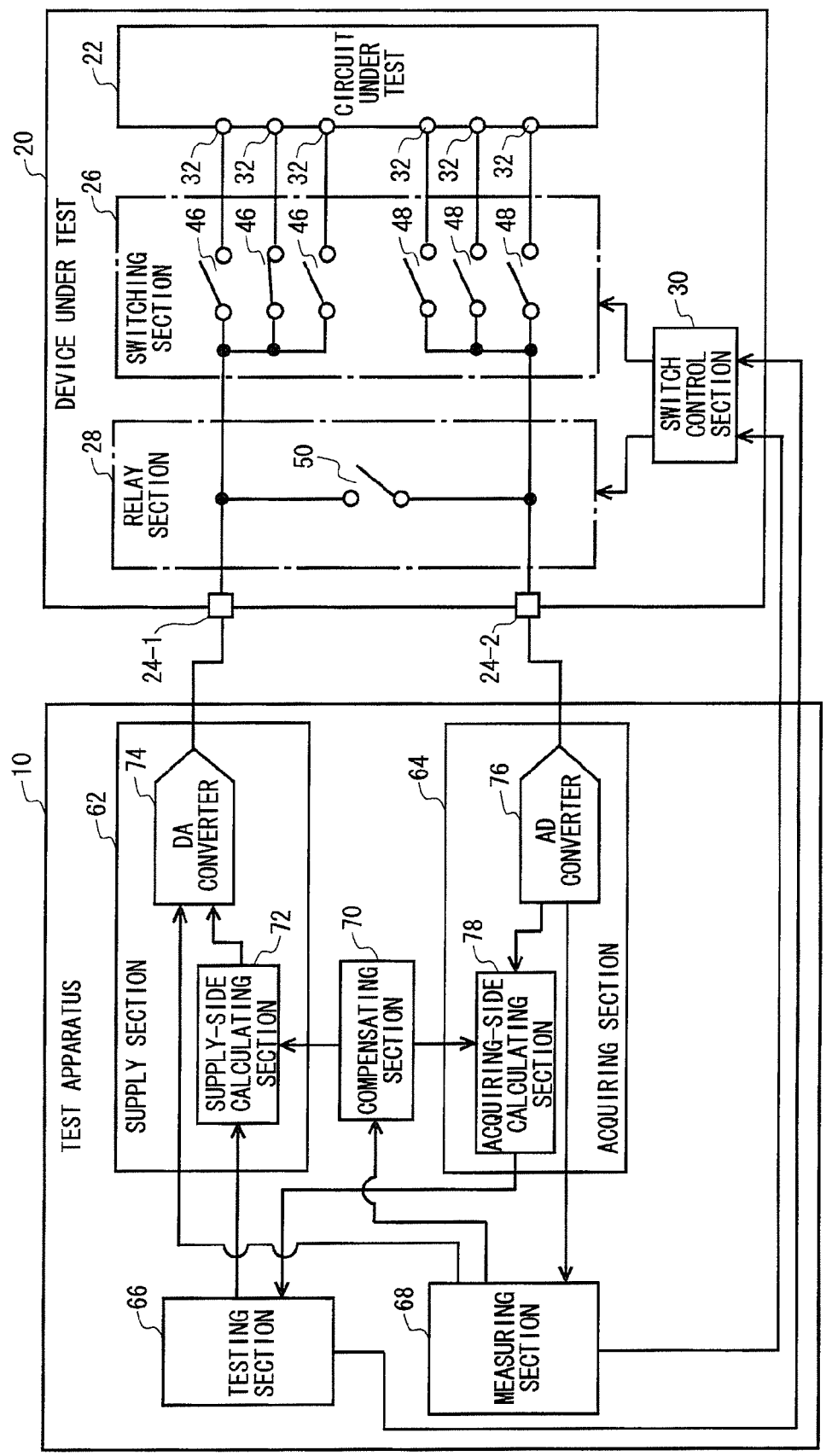
FIG. 4 shows configurations of the test apparatus 10 and the device under test 20 according to a first modification of the present embodiment.

FIG. 4 shows configurations of the test apparatus 10 and the device under test 20 according to a first modification of the present embodiment. The test apparatus 10 and the device under test 20 according to this modification adopt substantially the same function and configuration as the test apparatus 10 and the device under test 20 shown in FIG. 1, and therefore components having the same function and configuration as those shown in FIG. 1 are given the same reference numerals, and the following description includes only differing points.

The switching section 26 of the present modification includes one or more input change-over switches 46 and one or more output change-over switches 48. The input change-over switches 46 are provided to correspond one-to-one with the one or more internal terminals 32 that receive a signal from the test apparatus 10 during testing. Each input change-over switch 46 provides a connection or a disconnect between the external input terminal 24-1 and the corresponding internal terminal 32.

The output change-over switches 48 are provided to correspond one-to-one with the one or more internal terminals 32 from which the test apparatus 10 acquires a signal during testing. Each output change-over switch 48 provides a connection or a disconnect between the external output terminal 24-2 and the corresponding internal terminal 32.

The relay section 28 of the present modification includes a relay switch 50. The relay switch 50 provides a connection or a disconnect between the external input terminal 24-1 and the external output terminal 24-2.

Each input change-over switch 46, each output change-over switch 48, and the relay switch 50 have the same characteristics as each other. Accordingly, switches with identical characteristics are used to provide (i) the connection between the external input terminal 24-1 and each internal terminal 32 supplied with the signal from the test apparatus 10 during testing and (ii) the connection between the external input terminal 24-1 and the external output terminal 24-2. Furthermore, switches with identical characteristics are used to provide (i) the connection between the external output terminal 24-2 and each internal terminal 32 from which a signal is acquired by the test apparatus 10 during testing and (ii) the connection between the external input terminal 24-1 and the external output terminal 24-2.

The input change-over switches 46, the output change-over switches 48, and the change-over relay switch 50 may each be a semiconductor switch. In addition to providing a connection or a disconnect, the input change-over switches 46, the output change-over switches 48, and the change-over relay switch 50 may each include an amplifier, an attenuator, a buffer, a filter, or the like.

When measuring the transmission characteristic of the relay section 28, the measuring section 68 of the test apparatus 10 according to the present modification connects the relay switch 50 and disconnects all of the input change-over switches 46 and output change-over switches 48. In this way, the measuring section 68 can measure the transmission characteristic of the relay section 28 via the two external terminals 24.

The testing section 66 of the test apparatus 10 according to the present modification disconnects the relay switch 50 when testing the circuit under test 22. In the DAC mode, the testing section 66 connects the input change-over switch 46 corresponding to the internal terminal 32 being tested and disconnects all of the other input change-over switches 46.

In the ADC mode, the testing section 66 connects the output change-over switch 48 corresponding to the internal terminal 32 being tested and disconnects all of the other output change-over switches 48.

This device under test 20 can decrease the number of external terminals 24 used for testing. Furthermore, the device under test 20 allows the external test apparatus 10 to measure the transmission characteristic of the relay section 28, thereby enabling testing in which signal distortion between the external terminals 24 and the internal terminals 32 being tested is compensated for. Therefore, the test apparatus 10 enables signals having the desired waveforms to be accurately supplied to the internal terminals 32, and enables the signals output by the internal terminals 32 to be accurately acquired.

Figure 5:
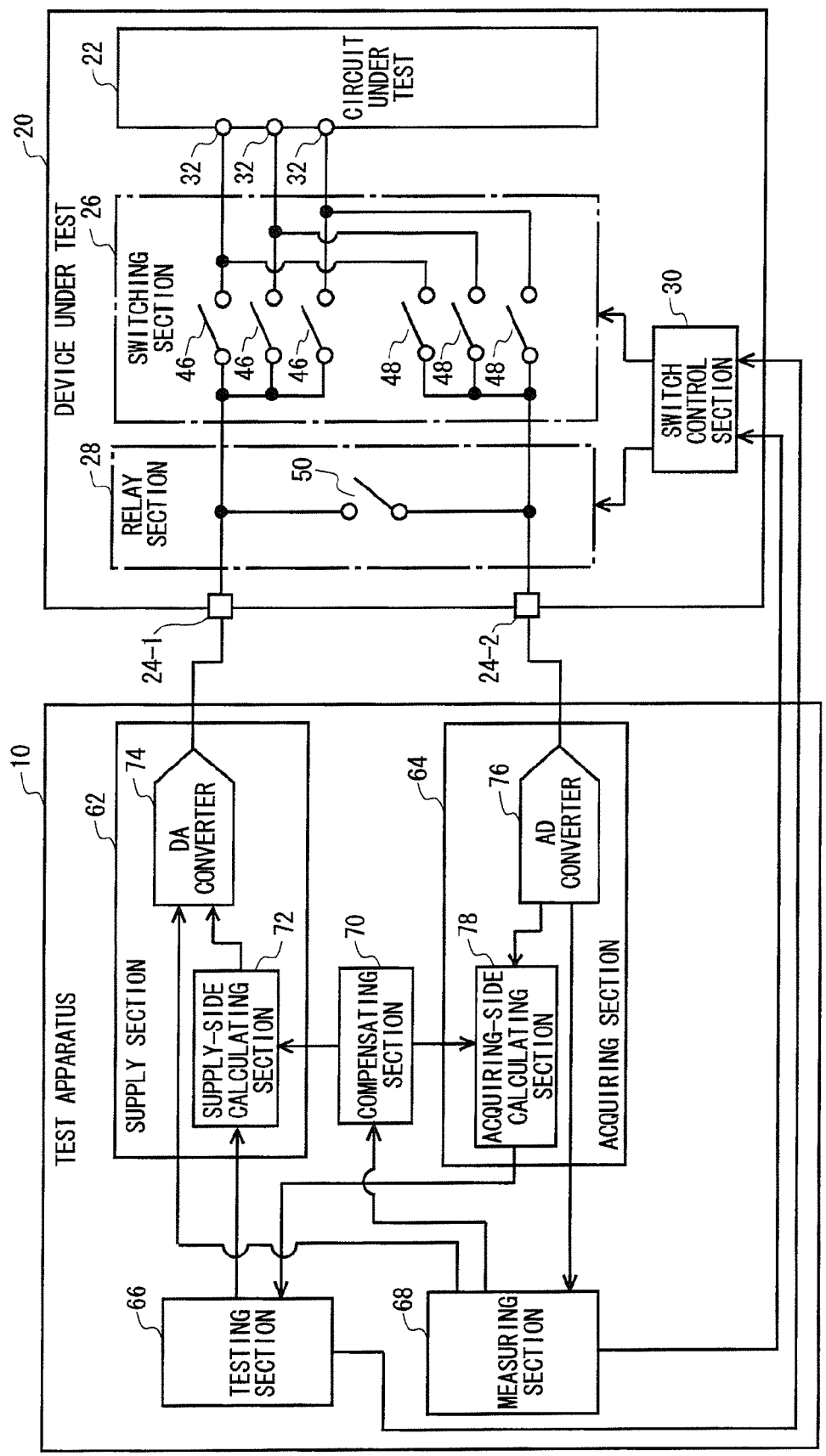
FIG. 5 shows a configuration of the test apparatus 10 and the device under test 20 according to a second modification of the present embodiment.

FIG. 5 shows a configuration of the test apparatus 10 and the device under test 20 according to a second modification of the present embodiment. The test apparatus 10 and the device under test 20 according to this modification adopt substantially the same function and configuration as the test apparatus 10 and the device under test 20 shown in FIG. 4, and therefore components having the same function and configuration as those shown in FIG. 4 are given the same reference numerals, and the following description includes only differing points.

The switching section 26 of the present modification includes one or more input change-over switches 46 and one or more output change-over switches 48. The input change-over switches 46 and the output change-over switches 48 are provided to correspond one-to-one with the one or more internal terminals 32 from which the test apparatus 10 acquires a signal and to which the test apparatus 10 supplies a signal during testing.

Each input change-over switch 46 provides a connection or a disconnect between the external input terminal 24-1 and the corresponding internal terminal 32. Each output change-over switch 48 provides a connection or a disconnect between the external output terminal 24-2 and the corresponding internal terminal 32.

In the present example, the relay switch 50 and the input change-over switches 46 have the same characteristics, but the relay switch 50 and the output change-over switches 48 need not have the same characteristics. In other words, (i) the connection between the external output terminal 24-2 and the internal terminals 32 from which the test apparatus 10 acquires a signal during testing and (ii) the connection between the external input terminal 24-1 and the external output terminal 24-2 need not be provided by switches having the same characteristic.

Figure 6:
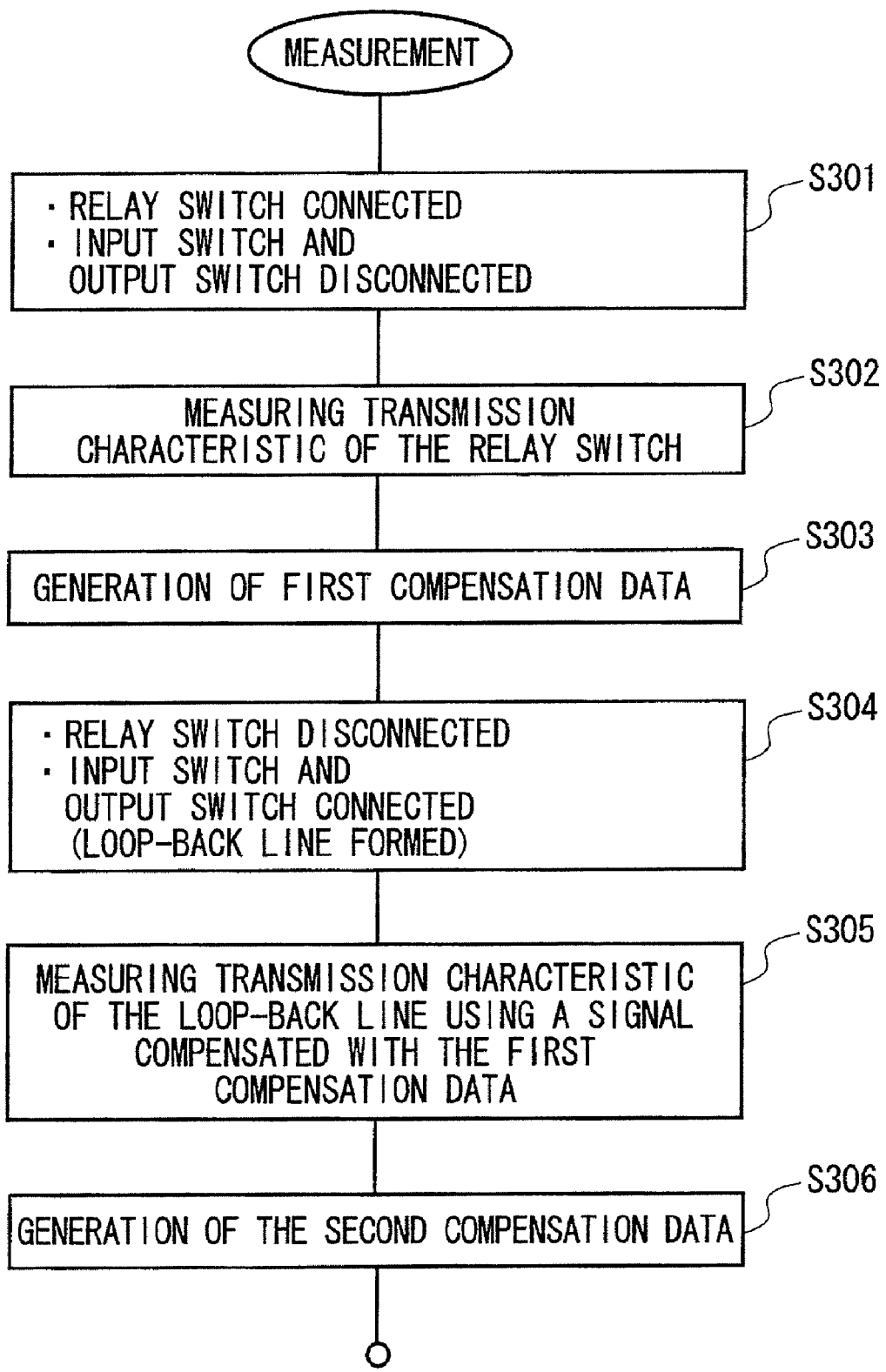
FIG. 6 shows a process flow of the test apparatus 10 according to the second modification for measuring the transmission characteristic of the relay section 28.

FIG. 6 shows a process flow of the test apparatus 10 according to the second modification for measuring the transmission characteristics of the relay section 28. First, the measuring section 68 connects the relay switch 50 and disconnects all of the input change-over switches 46 and output change-over switches 48 (S301).

Next, the measuring section 68 measures the transmission characteristics of the relay section 28, i.e. the relay switch 50, via the two external terminals 24 (S302). The measuring section 68 then generates first compensation data that compensates for the distortion in the lines between the external terminals 24 and the target input change-over switch 46, based on the measured transmission characteristic of the relay switch 50 (S303).

Next, the measuring section 68 disconnects the relay switch 50 and connects the input change-over switches 46 and the output change-over switches 48. In this way, the measuring section 68 can form a loop-back line between the external input terminal 24-1 and the external output terminal 24-2, via the input change-over switches 46 and the output change-over switches 48 (S304).

The measuring section 68 then measures the transmission characteristic of the loop-back line by supplying the external input terminal 24-1 with the signal compensated according to the transmission characteristics of the relay section 28 (S305). In this way, the measuring section 68 can measure the transmission characteristics of the output change-over switches 48.

Next, the measuring section 68 generates second compensation data that compensates for the distortion in the lines between the external output terminal 24-2 and the internal terminals 32, based on the measured transmission characteristics of the loop-back line (S306). For example, the measuring section 68 generates, as the compensation data, an inverse characteristic of the transmission characteristic of the loop-back line, i.e. the transmission characteristics of the output change-over switches 48. The measuring section 68 then stores the first compensation data and the second compensation data in the compensating section 70.

Figure 7:
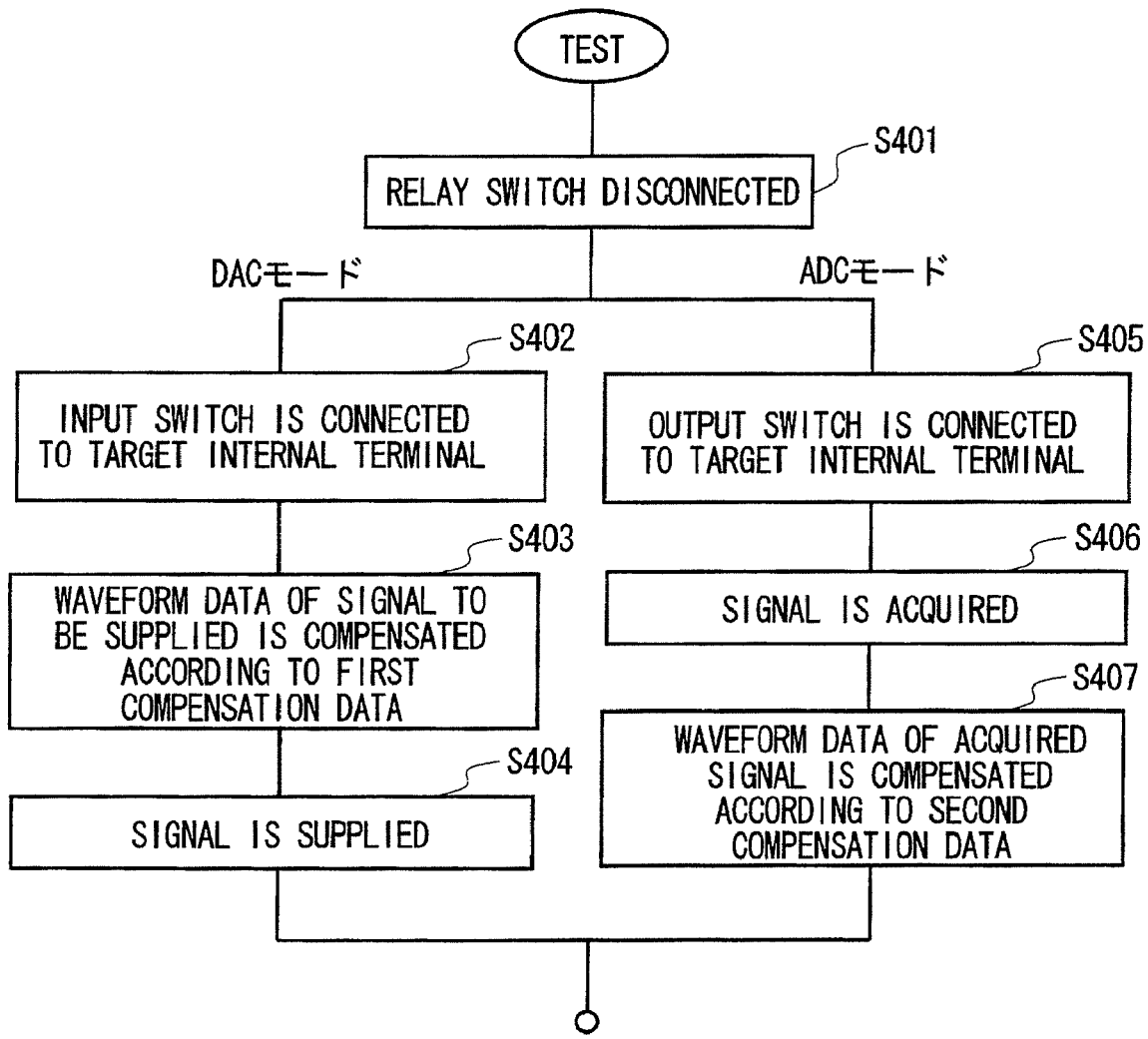
FIG. 7 shows the process flow of the test apparatus 10 according to the second modification for testing the circuit under test 22.

FIG. 7 shows the process flow of the test apparatus 10 according to the second modification for testing the circuit under test 22. First, the testing section 66 disconnects the relay section 28 of the device under test 20, i.e. the relay switch 50 (S401).

In the DAC mode, the testing section 66 connects the input change-over switch 46 corresponding to the internal terminal 32 being tested and disconnects all of the other input change-over switches 46 (S402). Next, in the DAC mode, the testing section 66 generates the waveform data of the signal supplied to the target internal terminal 32. The compensating section 70 then compensates the waveform data generated by the testing section 66, according to the first compensation data, and supplies the compensated waveform data to the DA converter 74 (S403).

Next, in the DAC mode, the DA converter 74 supplies a signal corresponding to the compensated waveform data to the external input terminal 24-1 (S404). In this way, in the DAC mode, the test apparatus 10 can supply the external input terminal 24-1 with a signal in which the distortion in the line between the external input terminal 24-1 and the target internal terminal 32 is compensated for.

In the ADC mode, on the other hand, the testing section 66 connects the output change-over switch 48 corresponding to the internal terminal 32 being tested, and disconnects all of the other output change-over switches 48. Next, the AD converter 76 AD converts the signal output from the external output terminal 24-2, and then outputs waveform data corresponding to the signal output from the external output terminal 24-2 (S406).

Next, in the ADC mode, the compensating section 70 compensates the waveform data output by the AD converter 76, according to the second compensation data, and supplies the compensated waveform data to the testing section 66 (S407). In this way, the test apparatus 10 can compensate for the distortion in the signal acquired from the external output terminal 24-2 arising in the line between the external output terminal 24-2 and the target internal terminal 32.

This device under test 20 can decrease the number of external terminals 24 used for testing. Furthermore, the device under test 20 allows the external test apparatus 10 to measure the transmission characteristic of the relay section 28, thereby compensating for the signal distortion between the external terminals 24 and the internal terminals 32 being tested. Therefore, the test apparatus 10 enables signals having the desired waveforms to be accurately supplied to the internal terminals 32, and enables the signals output by the internal terminals 32 to be accurately acquired.

Figure 8:
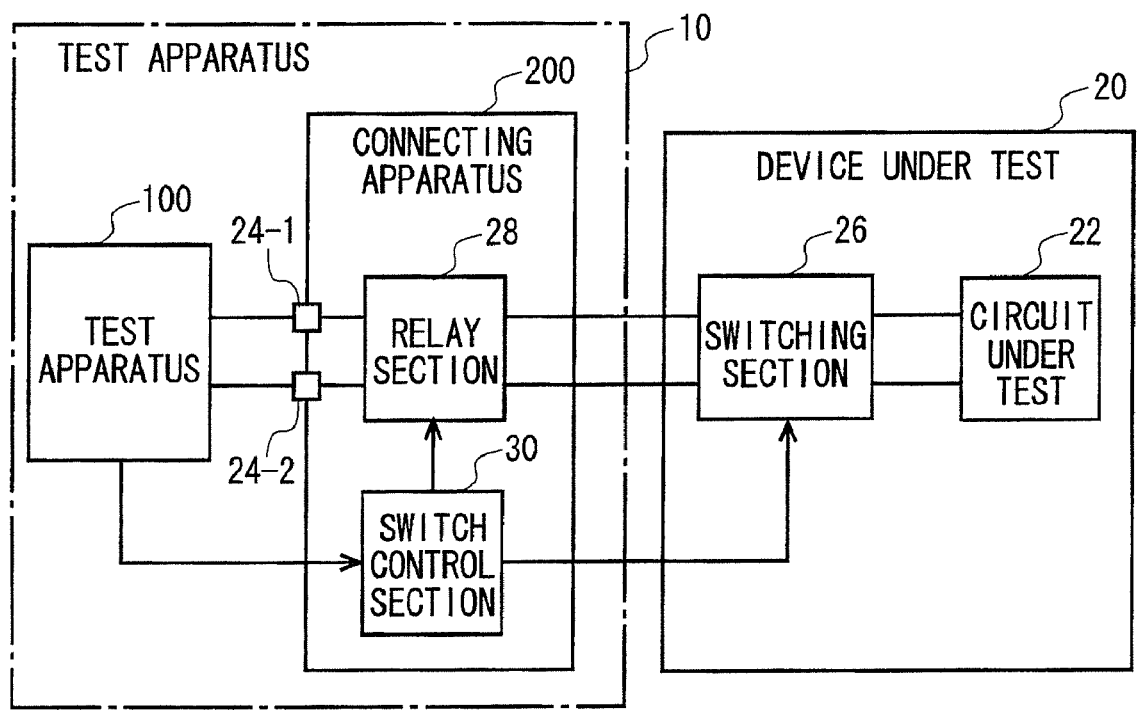
FIG. 8 shows a configuration of the test apparatus 10 and the device under test 20 according to a third modification of the present embodiment.

FIG. 8 shows a configuration of the test apparatus 10 and the device under test 20 according to a third modification of the present embodiment. The test apparatus 10 and the device under test 20 according to this modification adopt substantially the same function and configuration as the test apparatus 10 and the device under test 20 shown in FIG. 1, and therefore components having the same function and configuration as those shown in FIG. 1 are given the same reference numerals, and the following description includes only differing points.

The test apparatus 10 of the present modification is provided with a test apparatus body 100 and a connecting apparatus 200. The test apparatus body 100 has the same function and configuration as the test apparatus 10 shown in FIG. 1. The connecting apparatus 200 is provided between the test apparatus body 100 and the device under test 20, and electrically connects the test apparatus body 100 to the device under test 20. The connecting apparatus 200 may be a board or the like mounted on the test apparatus body 100.

The connecting apparatus 200 includes two external terminals 24, i.e. the external input terminal 24-1 and the external output terminal 24-2, the relay section 28, and the switch control section 30. The device under test 20 includes the switching section 26 and the circuit under test 22. In other words, the connecting apparatus 200 according to the present modification is provided with the device under test 20 shown in FIG. 1 in place of the two external terminals 24, the relay section 28, and the switch control section 30. The test apparatus 10 and the device under test 20 according to the present modification can be used to decrease the number of terminals for testing and to perform accurate testing by performing the compensation via the testing terminals, in the same manner as the test apparatus 10 and the device under test 20 shown in FIG. 1.

Figure 9:
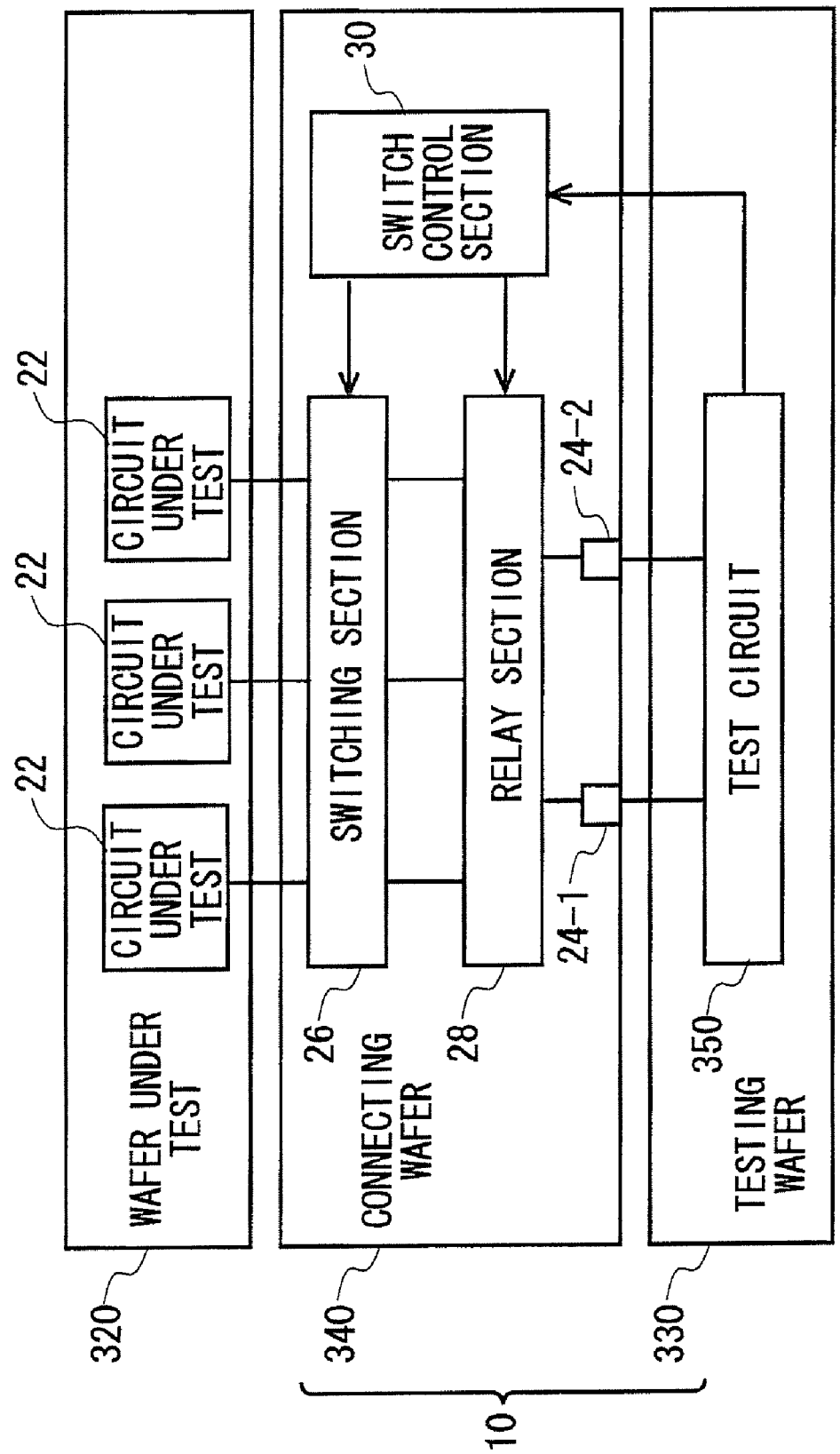
FIG. 9 shows configurations of the test apparatus 10 and a wafer under test 320 according to a fourth modification of the present embodiment.

FIG. 9 shows configurations of the test apparatus 10 and a wafer under test 320 according to a fourth modification of the present embodiment. The test apparatus 10 and the device under test 20 according to this modification adopt substantially the same function and configuration as the test apparatus 10 and the device under test 20 shown in FIG. 1, and therefore components having the same function and configuration as those shown in FIG. 1 are given the same reference numerals, and the following description includes only differing points.

The test apparatus 10 of the present modification tests the circuit under test 22 formed in the wafer under test 320. The test apparatus 10 includes a testing wafer 330 and a connecting wafer 340. The wafer under test 320, the testing wafer 330, and the connecting wafer 340 are each circular semiconductor substrates made of silicon, composite semiconductors, or other such materials. The wafer under test 320, the testing wafer 330, and the connecting wafer 340 are created according to a semiconductor process.

The wafer under test 320 includes one or more circuits under test 22 formed according to the semiconductor process. Each circuit under test 22 may be an independent device etched from the wafer under test 320 or may be a circuit in an independent device.

The testing wafer 330 includes a test circuit 350 formed according to a semiconductor process. The test circuit 350 exchanges signals with the circuits under test 22, and has the same function and configuration as the test apparatus 10 shown in FIG. 1. In other words, the wafer under test 320 of the present modification includes one or more circuits under test 22 provided to the device under test 20 shown in FIG. 1.

The connecting wafer 340 electrically connects the test circuit 350 to the circuits under test 22. The connecting wafer 340 includes the two external terminals 24, i.e. the external input terminal 24-1 and the external output terminal 24-2, the switching section 26, the relay section 28, and the switch control section 30, which are each formed according to a semiconductor process.

The two external terminals 24 of the connecting wafer 340 are connected to the test circuit 350 of the testing wafer 330. The switching section 26 of the connecting wafer 340 connects the external terminals 24 to the internal terminal 32 being tested, from among the one or more internal terminals 32 in each of the one or more circuits under test 22 in the wafer under test 320. In other words, the connecting wafer 340 of the present modification includes the two external terminals 24, the relay section 28, and the switch control section 30 that are provided in the device under test 20 shown in FIG. 1.

The test apparatus 10 according to the present modification can test a wafer-shaped device without using an apparatus having a plurality of pin probes. The test apparatus 10 and the wafer under test 320 according to the present modification can be used to decrease the number of terminals for testing and to perform accurate testing by performing the compensation via the testing terminals, in the same manner as the test apparatus 10 and the device under test 20 shown in FIG. 1.

Figure 10:
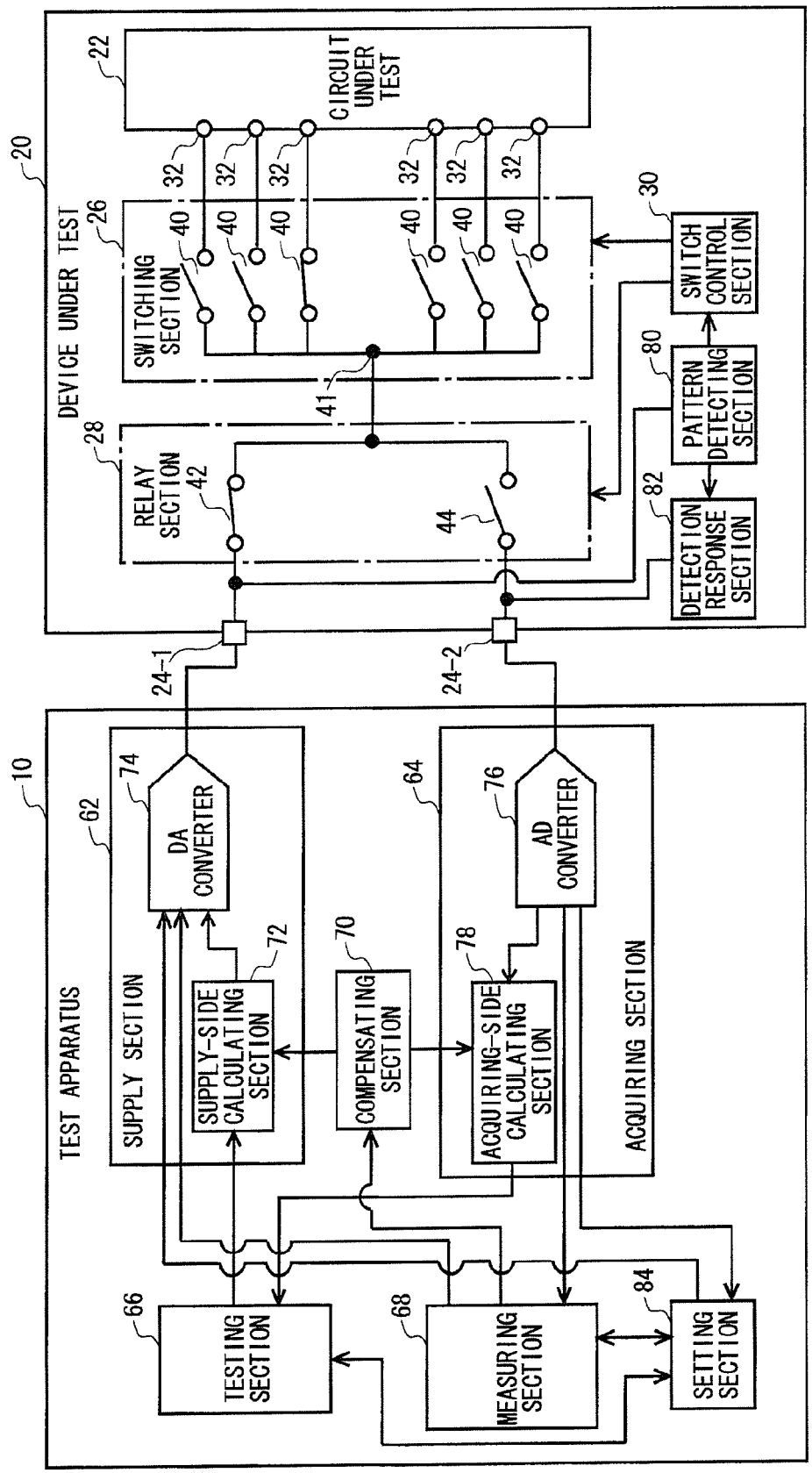
FIG. 10 shows configurations of the test apparatus 10 and the device under test 20 according to a fifth modification of the present embodiment.

FIG. 10 shows configurations of the test apparatus 10 and the device under test 20 according to a fifth modification of the present embodiment. The test apparatus 10 and the device under test 20 according to this modification adopt substantially the same function and configuration as the test apparatus 10 and the device under test 20 shown in FIG. 1, and therefore components having the same function and configuration as those shown in FIG. 1 are given the same reference numerals, and the following description includes only differing points.

The device under test 20 according to the present modification is further provided with a pattern detecting section 80 and a detection response section 82. The pattern detecting section 80 detects a signal having a preset waveform pattern supplied from the external test apparatus 10 to the external input terminal 24-1. In response to the pattern detecting section 80 detecting the preset waveform pattern, the detection response section 82 outputs a response signal corresponding to the detected waveform pattern to the test apparatus 10 via the external output terminal 24-2. The pattern detecting section 80 and the detection response section 82 both have impedances that are sufficiently low in relation to the impedance of the relay section 28 as seen from the external terminals 24. In other words, the loads of the pattern detecting section 80 and the detection response section 82 are sufficiently small.

The switch control section 30 according to the present modification controls whether the switching section 26 and the relay section 28 are connected based on the pattern detecting section 80 detecting the signal having the preset waveform pattern. For example, if the switch control section 30 is realized as a CPU, the switch control section 30 may receive the detection result from the pattern detecting section 80 via a bus or the like.

The test apparatus 10 according to the present modification is further provided with a setting section 84. The setting section 84 supplies the external input terminal 24-1 with a waveform pattern for setting the switching section 26 and the relay section 28 to the designated connection state. More specifically, the setting section 84 supplies setting data to the supplying section 62, thereby causing the supplying section 62 to output a signal having a waveform pattern that corresponds to the setting data.

The setting section 84 begins the testing of the circuit under test 22 or the measurement of the transmission characteristic of the relay section 28 in response to the detection of a prescribed response signal from the external output terminal 24-2 of the device under test 20. More specifically, the setting section 84 acquires, from the acquiring section 64, the waveform data corresponding to the signal acquired by the acquiring section 64, and judges whether the response signal is detected.

The setting section 84 performs the following process prior to the measurement of the transmission characteristics of the relay section 28 or the testing of the circuit under test 22. First, the setting section 84 supplies the external input terminal 24-1 with a signal having the waveform pattern that switches the switching section 26 and the relay section 28 into the designated connected state. In this case, the setting section 84 desirably generates a signal that has no correlation with the signal generated during testing or measuring.

Next, the pattern detecting section 80 detects the signal having the designated waveform pattern supplied from the external input terminal 24-1. For example, the pattern detecting section 80 detects a 0 or 1 pattern of the signal using a comparator and, based on the result, judges whether the signal having the designated waveform pattern is supplied.

When the pattern detecting section 80 detects the signal having the designated waveform pattern, the switch control section 30 switches the switching section 26 and the relay section 28 to the connected state designated by the waveform pattern, and the detection response section 82 supplies the external output terminal 24-2 with the response signal indicating that the designated waveform pattern has been detected. At this time, the switch control section 30 disconnects the relay section 28, i.e. the switch control section 30 disconnects at least one of the input relay switch 42 and the output relay switch 44.

Upon receiving the response signal from the external output terminal 24-2, the setting section 84 judges that the switch control section 30 has switched the switching section 26 and the relay section 28 to the designated connected state, and then supplies initiation instructions to the testing section 66 or the measuring section 68. In this way, the testing section 66 and the measuring section 68 can measure the transmission characteristics of the relay section 28 or test the circuit under test 22 after the relay section 28 and the circuit under test 22 are switched to the designated connected state.

The setting section 84 may instead perform the process describe above in response to the measurement of the transmission characteristics of the relay section 28 or the testing of the circuit under test 22 being completed. In this way, the setting section 84 can return the switching section 26 and the relay section 28 to the original connection state, for example, after the measurement or testing is completed. Instead, the switch control section 30 may return the switching section 26 and the relay section 28 to the original connected state after a prescribed time has passed since the measurement or testing is completed. In this way, the switch control section 30 can return the switching section 26 and the relay section 28 to the original connected state after it is certain that the measurement or testing is complete.

When testing or measuring the device under test 20, the test apparatus 10 according to the present modification can switch the connection state of the switching section 26 and the relay section 28 by supplying a signal from the external terminals 24. In this way, the number of terminals provided to the device under test 20 can be decreased.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A device, comprising:
    a circuit under test;
    two external terminals for connecting to an external test apparatus;
    a switching section that connects an internal terminal being tested, from among one or more internal terminals of the circuit under test, to the external terminals; and
    a relay section that is capable of providing a connection and a disconnect between one of the two external terminals and another of the two external terminals, such that a transmission characteristic of the relay section in a connected state serves as a basis for calculating the transmission characteristic between each external terminal and each internal terminal of the circuit under test.

2. The device according to claim 1, wherein the transmission characteristic of the relay section is measured by the external test apparatus via the two external terminals.

3. The device according to claim 1, wherein the switching section includes one or more change-over switches that correspond one-to-one with the one or more internal terminals and that each provide a connection or a disconnect between a common contact point and the corresponding internal terminal, and
    the relay section includes:
        an input relay switch that provides a connection or a disconnect between the external terminal on an input side and the common contact point; and
        an output relay switch that provides a connection or a disconnect between the external terminal on an output side and the common contact point.

4. A test apparatus that tests the device according to claim 3, the external terminals being connected to the test apparatus and the test apparatus comprising:
    a measuring section that controls whether the relay section provides the connection or the disconnection and measures the transmission characteristic of the relay section via the external terminals; and
    a compensating section that compensates a signal to be supplied to the circuit under test via one of the external terminals and the switching section and/or a signal acquired from the circuit under test via the switching section and one of the external terminals, based on the measured transmission characteristic of the relay section, wherein
    the measuring section sets the input relay switch and the output relay switch to a connected state when measuring the transmission characteristic of the relay section.

5. The device according to claim 1, wherein the switching section includes one or more input change-over switches that are provided to correspond one-to-one with the one or more internal terminals receiving a signal from the test apparatus, and that each provide a connection or a disconnect between the external terminal on the input side and the corresponding internal terminal, and
    the relay section includes a relay switch that provides a connection or a disconnect between the external terminal on the input side and the external terminal on the output side.

6. A test apparatus that tests the device according to claim 5, the external terminals being connected to the test apparatus and the test apparatus comprising:
    a measuring section that controls whether the relay section provides the connection or the disconnection and measures the transmission characteristic of the relay section via the external terminals; and
    a compensating section that compensates a signal to be supplied to the circuit under test via one of the external terminals and the switching section and/or a signal acquired from the circuit under test via the switching section and one of the external terminals, based on the measured transmission characteristic of the relay section, wherein
    the measuring section sets the relay switch to a connected state when measuring the transmission characteristic of the relay section.

7. The device according to claim 1, wherein
the switching section includes one or more output change-over switches that are provided to correspond one-to-one with the one or more internal terminals from which the test apparatus acquires a signal, and that each provide a connection or a disconnect between the external terminal on the output side and the corresponding internal terminal, and
the relay section includes a relay switch that provides a connection or a disconnect between the external terminal on the input side and the external terminal on the output side.

8. A test apparatus that tests the device according to claim 7, the external terminals being connected to the test apparatus and the test apparatus comprising:
a measuring section that controls whether the relay section provides the connection or the disconnection and measures the transmission characteristic of the relay section via the external terminals; and
a compensating section that compensates a signal to be supplied to the circuit under test via one of the external terminals and the switching section and/or a signal acquired from the circuit under test via the switching section and one of the external terminals, based on the measured transmission characteristic of the relay section, wherein
the measuring section sets the relay switch to a connected state when measuring the transmission characteristic of the relay section.

9. The device according to claim 1, wherein
the switching section includes:
one or more input change-over switches that are provided to correspond one-to-one with the one or more internal terminals, and that each provide a connection or a disconnect between the external terminal on the input side and the corresponding internal terminal; and
one or more output change-over switches that are provided to correspond one-to-one with the one or more internal terminals, and that each provide a connection or a disconnect between the external terminal on the output side and the corresponding internal terminal, and
the relay section includes a relay switch that provides a connection or a disconnect between the external terminal on the input side and the external terminal on the output side.

10. A test apparatus that tests the device according to claim 9, the external terminals being connected to the test apparatus and the test apparatus comprising:
a measuring section that controls whether the relay section provides the connection or the disconnection and measures the transmission characteristic of the relay section via the external terminals; and
a compensating section that compensates a signal to be supplied to the circuit under test via one of the external terminals and the switching section and/or a signal acquired from the circuit under test via the switching section and one of the external terminals, based on the measured transmission characteristic of the relay section, wherein
the measuring section sets the relay switch to a connected state when measuring the transmission characteristic of the relay section.

11. The test apparatus according to claim 10, wherein
the measuring section sets the relay switch to a disconnected state, sets the input change-over switches to a connected state, and sets the output change-over switches to a connected state to form a loop-back line between the external terminal on the input side and the external terminal on the output side, and measures the transmission characteristic of the loop-back line by supplying therethrough a signal compensated according to the transmission characteristic of the relay section, and
the compensating section compensates the signal supplied to the circuit under test via the external terminal on the input side and the input change-over switches, based on the transmission characteristic of the relay section, and compensates the signal acquired from the circuit under test via the external terminal on the output side and the output change-over switches, based on the measured transmission characteristic of the loop-back line.

12. The device according to claim 1, further comprising a switch control section that controls whether the switching section and the relay section are connected or disconnected according to instructions from an external section.

13. The device according to claim 12, further comprising a pattern detecting section that detects a signal having a predetermined waveform pattern supplied from the external section to the external terminal on the input side, wherein
the switch control section controls whether the switching section and the relay section are connected or disconnected according to the pattern detecting section detecting the signal having the predetermined waveform pattern.

14. The device according to claim 13, further comprising a detection response section that outputs a response signal to the external section via the external terminal on the output side, according to the pattern detecting section detecting the waveform pattern.

15. A test apparatus that tests the device according to claim 14, the external terminals being connected to the test apparatus and the test apparatus comprising:
a measuring section that controls whether the relay section provides the connection or the disconnection and measures the transmission characteristic of the relay section via the external terminals;
a compensating section that compensates a signal to be supplied to the circuit under test via one of the external terminals and the switching section and/or a signal acquired from the circuit under test via the switching section and one of the external terminals, based on the measured transmission characteristic of the relay section; and
a setting section that, prior to testing of the circuit under test or measuring of the transmission characteristic of the relay section, supplies the external terminal on the input side with the signal having the predetermined waveform pattern, wherein
the setting section begins testing of the circuit under test or measuring of the transmission characteristic of the relay section according to the detection of the response signal.

16. A test apparatus that tests the device according to claim 13, the external terminals being connected to the test apparatus and the test apparatus comprising:
a measuring section that controls whether the relay section provides the connection or the disconnection and measures the transmission characteristic of the relay section via the external terminals;
a compensating section that compensates a signal to be supplied to the circuit under test via one of the external terminals and the switching section and/or a signal acquired from the circuit under test via the switching section and one of the external terminals, based on the measured transmission characteristic of the relay section; and a setting section that, prior to testing of the circuit under test or measuring of the transmission characteristic of the relay section, supplies the external terminal on the input side with the signal having the predetermined waveform pattern.

17. The device according to claim 1, wherein
the transmission characteristic of a line between the two external terminals when the relay section is in the connected state is substantially equal to a prescribed multiple of the transmission characteristic of a line between the external terminals and each internal terminal connected via the switching section.

18. A test apparatus that tests the device according to claim 17, the external terminals being connected to the test apparatus and the test apparatus comprising:

a measuring section that controls whether the relay section provides the connection or the disconnection and measures the transmission characteristic of the relay section via the external terminals; and a compensating section that compensates a signal to be supplied to the circuit under test via one of the external terminals and the switching section and/or a signal acquired from the circuit under test via the switching section and one of the external terminals, based on the measured transmission characteristic of the relay section.

19. The device according to claim 17, wherein
the transmission characteristic of the line between the two external terminals when the relay section is in the connected state is substantially equal to the transmission characteristic of the line between the external terminals and each internal terminal connected via the switching section.

20. A test apparatus that tests the device according to claim 1, the external terminals being connected to the test apparatus and the test apparatus comprising:

a measuring section that controls whether the relay section provides the connection or the disconnection and measures the transmission characteristic of the relay section via the external terminals; and a compensating section that compensates a signal to be supplied to the circuit under test via one of the external terminals and the switching section and/or a signal acquired from the circuit under test via the switching section and one of the external terminals, based on the measured transmission characteristic of the relay section.

21. The test apparatus according to claim 20, further comprising
a testing section that, during testing of the circuit under test, sets the relay section to be in the disconnected state and i) supplies the signal to the circuit under test via one of the external terminals and the switching section or ii) acquires an output signal from the circuit under test via the switching section and one of the external terminals.

* * * * *